United States Patent [19]
Makino et al.

[11] Patent Number: 4,984,016
[45] Date of Patent: Jan. 8, 1991

[54] CASSETTE FOR PHOTO-SENSITIVE RECORDING MEDIUM

[75] Inventors: Kazumasa Makino, Nagoya; Yumio Matsumoto, Kasugai, both of Japan

[73] Assignee: Brother Kogyo Kabushiki Kaisha, Nagoya, Japan

[21] Appl. No.: 352,753

[22] Filed: May 16, 1989

[30] Foreign Application Priority Data

| May 19, 1988 | [JP] | Japan | 63-66116 |
| May 30, 1988 | [JP] | Japan | 63-72824 |
| May 30, 1988 | [JP] | Japan | 63-72825 |

[51] Int. Cl.⁵ .................................................. G03B 27/58
[52] U.S. Cl. ................................. 355/72; 354/277; 242/71.1
[58] Field of Search ............... 355/72, 73, 74, 75; 354/275, 277, 281, 283, 284, 288; 241/71, 71.1

[56] References Cited

U.S. PATENT DOCUMENTS

| 3,384,318 | 5/1968 | Nerwin et al. | 242/71.1 |
| 4,407,579 | 10/1983 | Huff | 354/275 |
| 4,616,914 | 10/1986 | Buelens et al. | 354/277 |

Primary Examiner—L. T. Hix
Assistant Examiner—Khanh Dang
Attorney, Agent, or Firm—Kane, Dalsimer, Sullivan, Kurucz, Levy, Eisele and Richard

[57] ABSTRACT

In a cassette for accomodating therein a continuous photo-sensitive recording medium a light-shield member is arranged in a feed passage communicating an accomodating chamber for the recording medium and a drawing opening through which the recording medium is drawn out of the cassette. The light-shield member is movable between its operative and inoperative positions. In it operative position, the light-shield member closes the feed passage to prevent the penetration of the ambient light. In its inoperative position, the light-shield member does not obstruct drawing out of the recording medium.

11 Claims, 5 Drawing Sheets

CASSETTE FOR PHOTO-SENSITIVE RECORDING MEDIUM

Background of the Invention

This invention relates to a cassette for accommodating therein a photo sensitive recording medium.

Japanese Utility Model Application No. 61-154168 filed on Oct. 7, 1987 in the name of the same assignee as the present application discloses a cassette for a photo and pressure sensitive recording medium wound into a roll. The cassette is formed in its peripheral wall with a drawing opening through which the recording medium is drawn out of the cassette. A de-charging brush is provided which extends along a peripheral edge of the drawing opening. The de-charging brush serves to prevent natural light from being penetrated into the cassette The de-charging brush also serves to prevent static electricity from being generated due to sliding contact of the recording medium with the peripheral edge of the drawing opening, thereby avoiding a malfunction of an electronic system of an exposure unit incorporated in an image recording apparatus such as a printer, a copying machine and the like.

However, the de-charging brush fails to sufficiently shield the light from being penetrated into the cassette thereby exposing the recording medium within the cassette to the penetrated light unintentionally.

SUMMARY OF THE INVENTION

It is therefore an object of this invention to provide an improved cassette for accommodating a photo-sensitive recording medium, capable of preventing light from being penetrated into the cassette, by a simple construction, thereby avoiding unintentional exposure of the recording medium to the light.

For the above purpose, according to the invention, there is provided a cassette for accommodating therin a photo-sensitive recording medium, which comprises;

- a cassette body having defined therein an accommodating chamber for the recording medium;
- a drawing opening formed in an outer surface of the cassette body, the recording medium being drawn out of the accommodating chamber through the drawing opening;
- a feed passage, defined by a pair of opposedly arranged wall sections, having one end thereof communicating with the accommodating chamber and the other end communicating with the drawing opening such that the recording medium passes through the feed passage when the recording medium is drawn out of the accommodating chamber through the drawing opening; and
- a light-shield member arranged in said feed passage, said member being formed of a resilient film, one end of which is secured to one of the wall sections while the other end normally contacts the other wall section due to the resiliency thereof so as to interrupt the penetration of an ambient light into the accomodating chamber.

BRIEF DESCRIPTION OF THE ACCOMPANYING DRAWINGS

DESCRIPTION OF THE EMBODIMENTS

Figure 1:
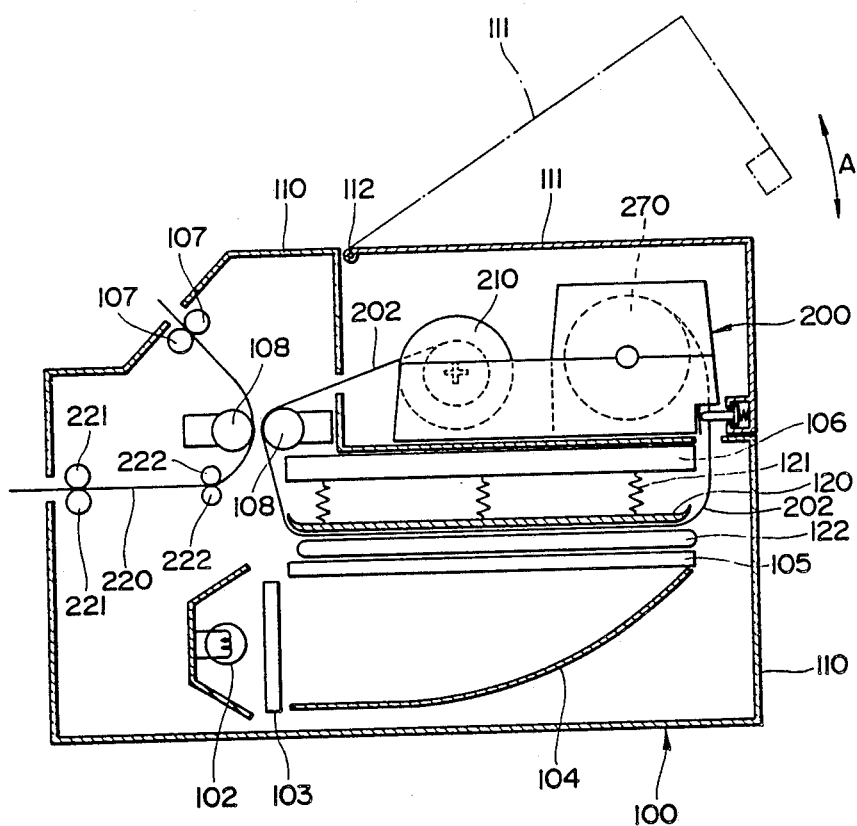
FIG. 1 is a side view showing principal parts of the arrangements of an imaging device, in which a cassette embodying the invention is seated.

FIG. 1 shows an imaging device of type which utilizes the photo and pressure sensitive recording medium disclosed in U.S. Pat. No. 4,399,209. The device comprises a body 100. A light source 102 is arranged at a lower location within the body 100. A color correction filter 103 is arranged on the right of the light source 102.

Arranged on the right of the filter 103 is a light diffusion plate 104 above which a glass platen 105 is arranged. A stationary frame 106 is arranged above the platen 105. A cassette 100 is fixedly mounted in an area defined by a machine frame 110 and a swingable cover plate 111. A continuous roll of photo and pressure sensitive web 202 is accommodated in a right-hand compartment of a cassette 200. A recoiler 210 is arranged within a left hand open compartment of the cassette 200. A pressure plate 120 is arranged between the stationary frame 106 and the platen 105, and is suspended from the stationary frame 106 through a plurality of springs 121 for movement toward and away from the platen 105. An original frame 122 capable of accommodating therein an original having carried thereon image information is arranged between the pressure plate 120 and the platen 105 for movement horizontally. A pair of pressure-fixing rollers 108 and 108 are arranged on the left of the stationary frame 106. A pair of heat-fixing rollers 107 and 107 are arranged above the pressure-fixing rollers 108 and 108. Arranged on the left of the pair of pressure-fixing rollers 108 and 108 are two pairs of feed rollers 221, 222 for feeding a sheet-like image transfer medium 220.

The original having carried thereon image information is set on the original frame 122 on the outside of the body 100. The original frame 122 is then inserted in the body 100 to a predetermined position between the pressure plate 120 and the platen 105. Subsequently, the pressure plate 120 is moved downwardly to urge a portion of the web 202 and the original frame 122 against the platen 105. The light source 102 is then switched on. Light emitted from the light source 102 passes through the color correction filter 103 and is diffusedly reflected by the diffusion plate 104. The light from the diffusion plate 104 is transmitted through the original set on the original frame 122, and exposes the portion of the web 202, thereby forming a latent image corresponding to the image information on the original, onto the portion of the web 202. After completion of the exposure, a moving unit (not shown) is driven to move the pressure plate 120 upwardly to release the close contact between the web 202 and the original frame 122. Subsequently, the image transfer medium 220 is inserted in the body 100 through an opening in the left hand side wall thereof. The feed rollers 221, 222 feed the image transfer medium 220 toward the pressure-fixing rollers 108 and 108. The thus fed image transfer medium 220 is superimposed upon the portion of the web 202 having carried thereon the latent image. The superimposed web and image transfer medium 202 and 220 are caused to pass through the nip between the pressure fixing rollers 108 and 108 to transfer the latent image on the portion of the web 202 onto the image transfer medium 220. Subsequently, only the image transfer medium 220 is caused to pass through the nip between the heat-fixing rollers 107, thereby bringing color developement to a good condition. The developed image transfer medium 220 is then discharged out of the body 100. On the other hand, the portion of the web 202 is wound around the recoiler roller 210.

Figure 2:
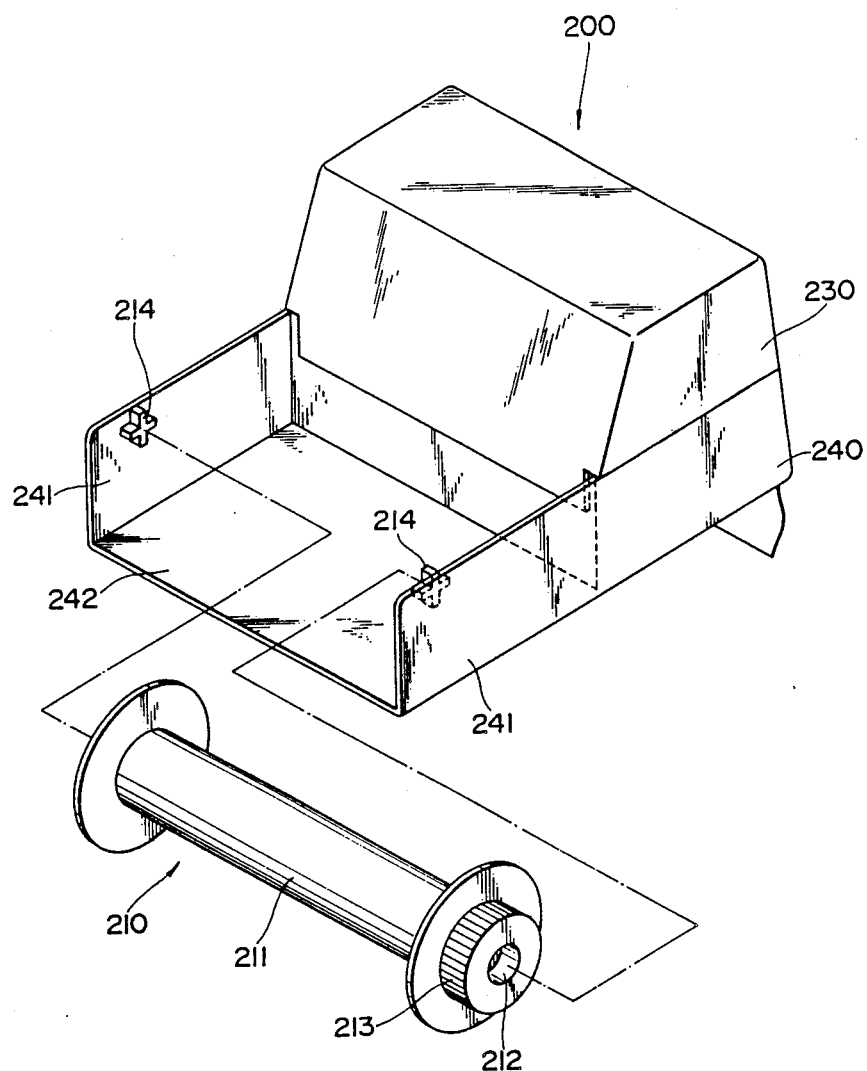
FIG. 2 is an exploded perspective view of the cassette shown in FIG. 1.
Figure 3:
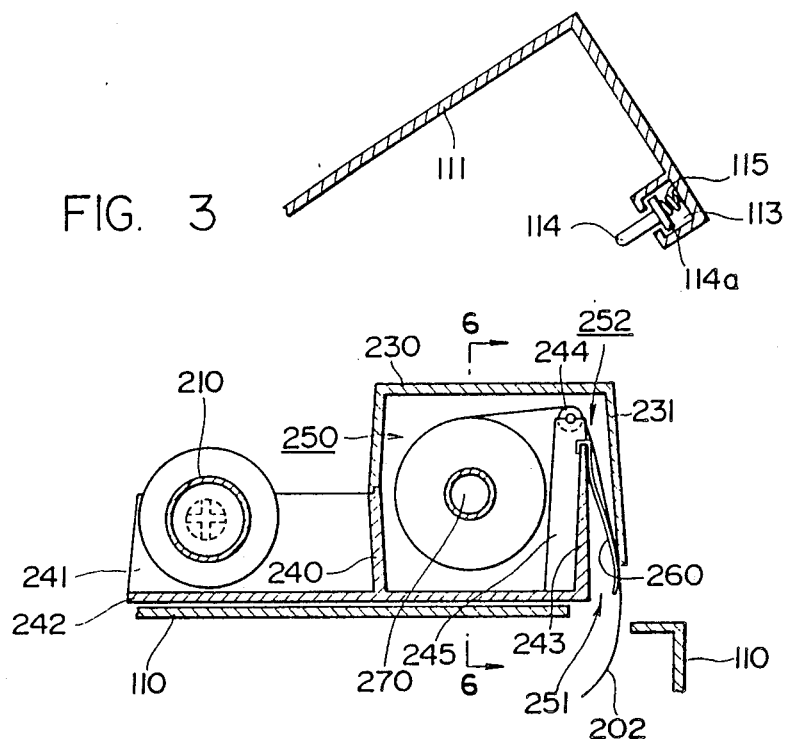
FIG. 3 is an enlarged sectional view of the cassette shown in FIG. 1 while a cover plate of the imaging device is open.

The cassette 200 comprises, as illustrated in FIGS. 2 and 3, a pair of cassette halves 230 and 240 formed of synthetic resin. The pair of cassette halves 230 and 240 are united together to form a cassette body having defined therein an accommodating chamber 250 for the recording medium in the form of a continuous web 202 wound into a roll about an uncoiler 270. The pair of cassette halves 230 and 240 cooperate with each other to define a drawing opening 251 through which the unused continuous web 202 is drawn out of the accommodating chamber 250.

The one cassette half 240 has, as shown in FIG. 2, a pair of opposed, but spaced extension support wall sections 241 integral with the one cassette half 240. A connecting wall section 242 extends between the pair of support wall sections 241 in integral relation thereto.

As shown in FIG. 3, a wall section 231 of the one cassette half 230 and a wall section 243 of the other cassette half 240 cooperate with each other to define therebetween a feed passage 252 for bringing the accommodating chamber 250 into communication with the drawing opening 251.

A light-shield member 260 which comprises a rectangular-shaped plastic film, which is resilient and not permeable to light, is arranged in the feed passage 252. One end of the light-shield member 260 is secured to the upper end of the wall section 243, while the other free end contacts the lower portion of the wall section 231 of the cassette half 230 due to the resiliency of the light-shield member 260.

A guide roller 244 is rotatably supported by a pair of brackets 245 (only one shown) and is arranged at connection between the feed passage 252 and the accomodating chamber 250.

The inverted L-shaped swingable cover plate 111 is, as shown in FIG. 1, connected to the machine frame 110 by means of a hinge mechanism 112, and is swingable in the direction indicated by the arrow A in FIG. 1.

The cover plate 111 is provided with a pair of inwardly projected recesses 113 (only one shown) at the free end thereof. A pin 114 having a rear flange 114a is accommodated in each recess 113. A spring 115 is extended between the inner surface of the recess 113 and the rear flange 114a so as to bias the pin 114 outwardly of the recess 113.

Figure 4:
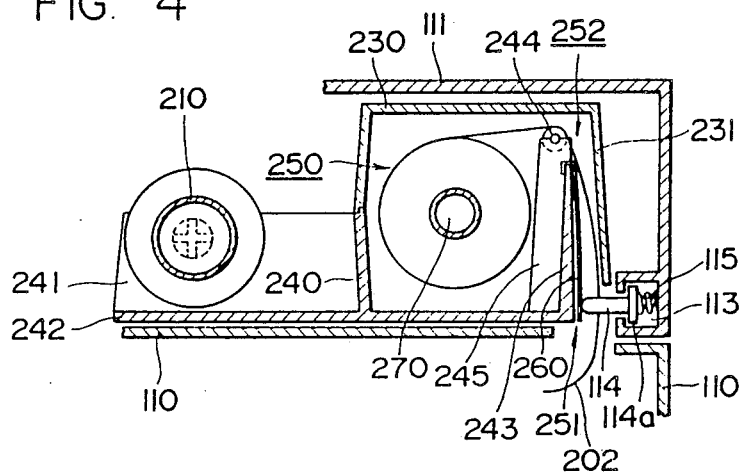
FIG. 4 is an enlarged sectional view of the cassette shown in FIG. 1 while a cover plate of the imaging device is closed.
Figures 5, 6:
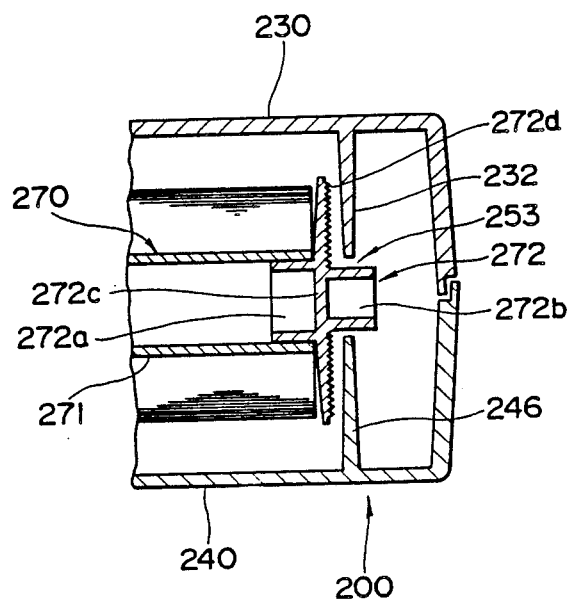
FIG. 5 is an explanatory view showing positional relations among a light-shield member, a recording medium and an operating member shown from right in FIG. 4.
FIG. 6 is a fragmentary enlarged cross-sectional view taken along the line VI—VI in FIG. 3.

Accordingly, in case that the cover plate 111 is upwardly swung to its open oposition as illustrated in FIG. 3, the cassette 200 can be taken into and out of the body 100. On the other hand, in case that the cover plate 111 is swung downwardly to its closed position, as illustrated in FIG. 4, after the cassette 200 is put inside the body 100, the pin 114 pushes the light-shield member 260 toward the wall 243. As illustrated in FIG. 5, the width of the light-shield member 260 is formed to be larger than that of the recording medium 202. So, even if the pins 114 across the feed passage 252, feeding of the recording medium 202 is not obstructed. Thus, the light shield member 260 interrupts the light passing into the cassette 200 before the cassette 200 is set in the body 100, while the feed passage 252 is open after the cassette 200 is set in the body 100 and the cover plate 111 is closed, as the pins 114 push the light-shield member 260 toward the wall 243.

As described above with reference to FIGS. 3 through 5, the light-shield member 260 associated with the feed passage 252 can interrupt the ambient light penetrated into the feed passage 252 through the drawing opening 251, making it possible to prevent natural light-exposure of the roll of the continuous web 202. Thus, it can be ensured to maintain the image quality of the continuous web 202 and to use the same in a stable manner.

As shown in FIG. 6, the one cassette half 230 is integrally formed with a pair of downwardly extending inner wall 232 (only one shown). Likewise, the other cassette half 240 is integrally formed with a pair of upwardly extending inner wall 246 (only one shown). When one and other cassette halves 230 and 240 are united together, the pair of inner walls 232 and the pair of inner walls 246 cooperate respectively with each other to form a pair of bearing sections 253 (only one shown) for rotatably supporting the opposite axial ends of the uncoiler 270, respectively.

The uncoiler 270 comprises a hollow core member 271 and a pair of flange members 272 (only one shown) coupled to the both ends of the core member 271, respectively. Each flange member 272 comprises an inner boss 272a and an outer boss 272b each extended from a disc wall member 272c along the central axis of the disc wall member 272c. The inner boss 272a is securely coupled to the hollow portion of the core member 271 while the outer boss 272b is rotatably supported by the pair of inner walls 232 and 246.

On the outer surface of the disc wall member 272c, a plurality of cocentric circle grooves 272d are formed to diffusedly reflect the light entered into the cassette 200. Thereby, it can be prevented for the recording web 202 wound on the uncoiler 270 to be exposed to ambient light invaded through the joint area of the cassette 200.

Turning back to FIG. 2, a pair of cruciform ribs 214 and 214 are fixedly mounted respectively to the inner surfaces of the respective support wall sections 241 and 241. On the other hand, the recoiler 210 comprises a core member 211 which has its opposite axial end faces which are formed therein with respective bores 212 (only one shown) The recoiler 210 is rotatably supported by the pair of support wall sections 241 and 241 in such a manner that the pair of ribs 214 and 214 are fitted, with a slight play, respectively into the bores 212. One of the opposite axial ends of the core member 211 is formed with gear teeth 213 which is adapted to be drivingly connected to a drive motor through a gear train (both not shown).

Figure 7:
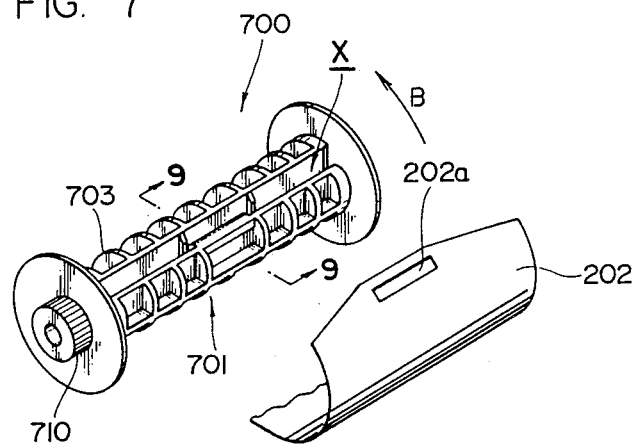
FIG. 7 is a perspective view of a modified recoiler.
Figure 8:
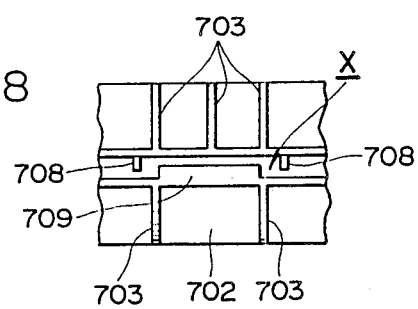
FIG. 8 is a fragmentary plan view of the recoiler shown in FIG. 7.
Figure 9:
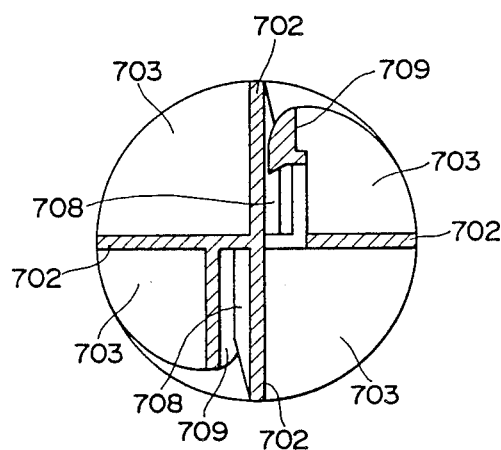
FIG. 9 is a sectional view of the recoiler taken along the line IX—IX in FIG. 7.

FIGS. 7 through 9 show a modified recoiler 700. The recoiler 700 comprises a core member 701 having a substantially cruciform section as shown in FIG. 9. In each space defined by the adjacent pair of wing walls 702, a plurality of quater-circular rib plates 703 are arranged, on which the recording web 202 fed from the uncoiler 270 is taken up.

A pair of slits X extending along an axial direction of the core member 701 is formed on the circumferentially opposite sides of the core member 701. In each slit X, a hanger rib 709 and a pair of guide ribs 708, 708 are formed on the opposed inner walls of the slit X. A slit 202a formed on the front end of the recording web 202 is hooked to the hanger rib 709, and the release of the recording web 202 from the hanger rib 709 is prevented by the guide ribs 708, 708 positioned at both sides of the slit 202a of the recording web 202.

The upper portion of each of the guide rib 708 is formed to be inclined so as to guide the insertion of the front end of the recording web 202 into the slit X, while the lower portion of the hanger rib 709 is formed to have an acute section.

With the above constructed recoiler 700, first the front end 202a of the recording web 202 is inserted into one of the slits X. When the recording web 202 is being inserted into the slit X, it is being pressed toward the hanger rib 709 by means of the guide ribs 708, 708.

After the front end of the recording web 202 is sufficiently inserted into the slit X, the rotary force is transmitted to the gear 710 from the body 100 to rotate the recoiler 700 in the direction of the arrow B in FIG. 7. With the rotation of the recoiler 700 the slit 202a of the front end of the recording web 202 approaches and engages the lower edge of the hanger rib 709. Thus, the front end of the recording web 202 is easily fitted to the recoiler 700.

The core member 701, the hanger rib 709 and guide ribs 708, 708 can be formed as one unit by injection molding of synthetic resin.

What is claimed is:

1. A cassette for accommodating therein a photo-sensitive recording medium, which comprises;
    a cassette body having defined therein an accommodating chamber for the recording medium;
    a drawing opening formed in an outer surface of the cassette body, the recording medium being drawn out of the accommodating chamber through the drawing opening;
    a feed passage, defined by a pair of opposedly arranged wall sections, having one end thereof communicating with the accommodating chamber and the other end communicating with the drawing opening such that the recording medium passes through the feed passage when the recording medium is drawn out of the accommodating chamber through the drawing opening; and
    a light-shield member arranged in said feed passage, said member being formed of a resilient film, one end of which is secured to one of the wall sections while the other end is biased to normally contact the other wall section due to the resiliency thereof so as to press said recording medium to said other wall section and interrupt the penetration of an ambient light into the accommodating chamber.

2. An imaging device employing a cassette for accommodating therein a continuous photo-sensitive recording medium, wherein said cassette comprises;
    a cassette body having defined therein an accommodating chamber for the recording medium;
    a drawing opening formed in an outer surface of the cassette body, the recording medium being drawn out of the accommodating chamber through the drawing opening;
    a feed passage, defined by a pair of opposedly arranged wall sections, having one end thereof communicating with the accommodating chamber and the other end communicating with the drawing opening such that the recording medium passes through the feed passage when the recording medium is drawn out of the accommodating chamber through the drawing opening; and
    a light-shield member arranged in said feed passage, said member being formed of a resilient film, one end of which is secured to one of the wall sections while the other end normally contacts the other wall section due to the resiliency thereof so as to interrupt the penetration of an ambient light into the accommodating chamber;
    and wherein said imaging device comprises an operating means for urging said other end of the light-shield member to said one wall section against the resiliency so as to open said feed passage.

3. The imaging device according to claim 2, wherein said operating means comprises a swingable plate and a pair of spring-biased pin members arranged on said swingable plate, said swingable plate being swingable between an operating position and an inoperating position, said pin members pressing the light-shield member against said one of the wall sections in case said swingable plate is positioned at the operating position.

4. The imaging device according to claim 3, wherein said light-shield member has its width larger than the width of the recording medium, and wherein said pair of pin members are arranged on said swingable plate with being spaced apart at the interval larger than the width of the recording medium but smaller than the width of the light shield member.

5. A cassette for accommodating therein a continuous photo-sensitive recording medium, which comprises;
    a pair of cassette halves formed of synthetic resin, the pair of cassette halves being united together to form a cassette body having defined therein an accommodating chamber for the recording medium;
    a drawing opening formed in an outer surface of the cassette body, the recording medium being drawn out of the accommodating chamber through the drawing opening; and
    an uncoiler rotatably supported in said accommodating chamber, said uncoiler being provided with a pair of flange members at both end portions thereof, the area between which the recording medium is wound, each of said flanges being provided, on its outer side surface, with a diffused-reflection means for diffusedly reflecting light penetrated into the accomodating chamber through joint area of said cassetted halves.

6. The cassette according to claim 5, wherein said diffused-reflection means comprises a plurality of cocentric circle grooves formed on said outer side surface of each flange member.

7. A cassette for accommodating therein a continuous photo-sensitive recording medium, which comprises;
    a cassette body having defined therein an accommodating chamber for the recording medium;
    a drawing opening formed in an outer surface of the cassette body, the recording medium being drawn out of the accommodating chamber through the drawing opening;

an uncoiler rotatably supported in said accommodating chamber;

a recoiler supporting section extended from said cassette body; and a recoiler rotatably supported at said recoiler supporting section for winding up the continuous recording medium fed from said uncoiler comprising a core member provided with a pair of slits extending along the axial direction of the core member, said pair of slits being arranged at the circumferentially opposed positions, and a hook member provided in each of said slits for hooking a front end portion of said continuous recording medium.

8. A recoiler for winding up a continuous recording medium, which comprises;

a core member provided with a pair of slits extending along the axial direction of the core member, said pair of slits being arranged at the circumferentially opposed positions; and a hook member provided in each of said slits for hooking a front end portion of said continuous recording medium.

9. The recoiler according to claim 8 wherein said hook member comprises a hanger rib formed on one inner wall of said each of the slits; wherein said recoiler further comprises a pair of guide ribs formed on the other inner wall of said each of the slits, said pair of guide ribs being arranged at the symmetrical positions about said hanger rib; and wherein said hanger rib and said pair of guide ribs are overlapped each other in the circumferential direction of said core member.

10. The recoiler according to claim 9 wherein the lower portion of said hanger rib is formed to have an acute section, and wherein the upper portion of each of said guide ribs is formed to be inclined so as to guide the insertion of the front end portion of said continuous recording medium.

11. A cassette for accommodating therein a photosensitive recording medium, which comprises:

a cassette body having defined therein an accommodating chamber for the recording medium;

a drawing opening formed in an outer surface of the cassette body, the recording medium being drawn out of the accommodating chamber through the drawing opening;

a feed passage, defined by a pair of spaced apart opposedly arranged wall sections, having one end thereof communicating with the accommodating chamber and the other end communicating with the drawing opening such that the recording medium passes through the feed passage when the recording medium is drawn out of the accommodating chamber through the drawing opening, said feed passage extending such that direct penetration of an ambient light from the drawing opening into the accommodating chamber through the feed passage is prevented; and a light-shield member arranged in said feed passage, said member being formed of a resilient film, one end of which is secured to one of the wall sections while the other end is biased so as to normally contact the other wall section due to the resiliency thereof so as to interrupt the penetration of said ambient light into the accommodating chamber.

* * * * *